(12) United States Patent
Long et al.

(10) Patent No.: US 7,625,602 B2
(45) Date of Patent: *Dec. 1, 2009

(54) CONTROLLABLY FEEDING POWDERED OR GRANULAR MATERIAL

(75) Inventors: Michael Long, Hilton, NY (US); Neil P. Redden, Sodus Point, NY (US); Bruce E. Koppe, Caledonia, NY (US); Thomas W. Palone, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 774 days.

This patent is subject to a terminal disclaimer.

(21) Appl. No.: 11/121,242

(22) Filed: May 3, 2005

(65) Prior Publication Data

US 2006/0251811 A1 Nov. 9, 2006

(51) Int. Cl.
*C23C 16/00* (2006.01)
(52) U.S. Cl. .................. 427/248.1; 427/66; 427/69; 427/70; 118/726
(58) Field of Classification Search .............. 118/726; 427/66, 70, 255.6, 69, 248.1–255.7
See application file for complete search history.

(56) References Cited

U.S. PATENT DOCUMENTS 2,447,789 A 8/1948 Barr

| | | | |
|---|---|---|---|
| 4,748,313 A * | 5/1988 | de Rudnay | 392/391 |
| 4,769,292 A | 9/1988 | Tang et al. | |
| 4,885,211 A | 12/1989 | Tang et al. | |
| 6,470,737 B1 * | 10/2002 | De Bona et al. | 73/64.56 |
| 7,118,783 B2 * | 10/2006 | Carpenter et al. | 427/255.23 |
| 7,288,285 B2 * | 10/2007 | Long et al. | 427/248.1 |
| 2005/0016461 A1 | 1/2005 | Klug et al. | |
| 2005/0072361 A1 * | 4/2005 | Yang et al. | 118/726 |

FOREIGN PATENT DOCUMENTS

| | | |
|---|---|---|
| EP | 1103497 | 5/2001 |
| JP | 2000-248358 | * 9/2000 |
| JP | 2003-293121 | * 10/2003 |
| SU | 779441 | 11/1980 |
| WO | WO 2006/119403 | 11/2006 |

* cited by examiner

*Primary Examiner*—Frederick J. Parker
*Assistant Examiner*—Jimmy Lin
(74) *Attorney, Agent, or Firm*—Raymond L. Owens

(57) ABSTRACT

A method for metering powdered or granular material onto a heated surface to vaporize such material. The method comprises providing a rotatable auger d for receiving powdered or granular material and as the rotatable auger rotates, such rotatable auger translates such powdered or granular material along a feed path to a feeding location. The method also providing at least one opening at the feeding location such that the pressure produced by the rotating rotatable auger at the feeding location causes the powdered or granular material to be forced through the opening onto the heated surface in a controllable manner. The material is agitated or fluidized proximate to the feeding location.

7 Claims, 4 Drawing Sheets

CONTROLLABLY FEEDING POWDERED OR GRANULAR MATERIAL

CROSS-REFERENCE TO RELATED APPLICATIONS

Reference is made to commonly assigned U.S. Pat. No. 7,232,588 issued Jun. 19, 2007, by Michael Long et al, entitled "Device and Method for Vaporizing Temperature Sensitive Materials", U.S. Pat. No. 7,288,285 issued Oct. 30, 2007, by Michael Long et al, entitled "Delivering Organic Powder to a Vaporization Zone", U.S. Pat. No. 7,288,286 issued Oct. 30, 2007, by Michael Long et al, entitled "Delivering Organic Power to a Vaporization Zone", U.S. Patent Publication No. 2006/0177576 published Aug. 10, 2006, by Michael Long et al, entitled "Controllably Feeding Organic Material in Making OLEDS", and U.S. Pat. No. 7,213,347 issued May 8, 2007, by Michael Long et al, entitled Metering Material To Promote Rapid Vaporization" the disclosures of which are incorporated herein by reference.

FIELD OF THE INVENTION

The present invention relates to making devices by vaporizing material and more particularly to controllably feeding material to a heated surface.

BACKGROUND OF THE INVENTION

An organic light emitting diode (OLED) device includes a substrate, an anode, a hole-transporting layer made of an organic compound, an organic luminescent layer with suitable dopants, an organic electron-transporting layer, and a cathode. OLED devices are attractive because of their low driving voltage, high luminance, wide-angle viewing and capability for full-color flat emission displays. Tang et al. described this multilayer OLED device in their U.S. Pat. Nos. 4,769,292 and 4,885,211.

Physical vapor deposition in a vacuum environment is the principal means of depositing thin organic material films as used in small molecule OLED devices. Such methods are well known, for example Barr in U.S. Pat. No. 2,447,789 and Tanabe et al. in EP 0 982 411. The organic materials used in the manufacture of OLED devices are often subject to degradation when maintained at or near the desired rate dependant vaporization temperature for extended periods of time. Exposure of sensitive organic materials to higher temperatures can cause changes in the structure of the molecules and associated changes in material properties.

To overcome the thermal sensitivity of these materials, only small quantities of organic materials have been loaded in sources and they are heated as little as possible. In this manner, the material is consumed before it has reached the temperature exposure threshold to cause significant degradation. The limitations with this practice are that the available vaporization rate is very low due to the limitation on heater temperature, and the operation time of the source is very short due to the small quantity of material present in the source. In the prior art, it has been necessary to vent the deposition chamber, disassemble and clean the vapor source, refill the source, reestablish vacuum in the deposition chamber and degas the just-introduced organic material over several hours before resuming operation. The low deposition rate and the frequent and time consuming process associated with recharging a source has placed substantial limitations on the throughput of OLED manufacturing facilities.

A secondary consequence of heating the entire organic material charge to roughly the same temperature is that it is impractical to mix additional organic materials, such as dopants, with a host material unless the vaporization behavior and vapor pressure of the dopant is very close to that of the host material. This is generally not the case and as a result, prior art devices frequently require the use of separate sources to co-deposit host and dopant materials.

A consequence of using single component sources is that many sources are required in order to produce films containing a host and multiple dopants. These sources are arrayed one next to the other with the outer sources angled toward the center to approximate a co-deposition condition. In practice, the number of linear sources used to co-deposit different materials has been limited to three. This restriction has imposed a substantial limitation on the architecture of OLED devices, increases the necessary size and cost of the vacuum deposition chamber and decreases the reliability of the system.

Additionally, the use of separate sources creates a gradient effect in the deposited film where the material in the source closest to the advancing substrate is over represented in the initial film immediately adjacent the substrate while the material in the last source is over represented in the final film surface. This gradient co-deposition is unavoidable in prior art sources where a single material is vaporized from each of multiple sources. The gradient in the deposited film is especially evident when the contribution of either of the end sources is more than a few percent of the central source, such as when a co-host is used.

A further limitation of prior art sources is that the geometry of the interior of the vapor manifold changes as the organic material charge is consumed. This change requires that the heater temperature change to maintain a constant vaporization rate and it is observed that the overall plume shape of the vapor exiting the orifices can change as a function of the organic material thickness and distribution in the source, particularly when the conductance to vapor flow in the source with a full charge of material is low enough to sustain pressure gradients from non-uniform vaporization within the source. In this case, as the material charge is consumed, the conductance increases and the pressure distribution and hence overall plume shape improve.

SUMMARY OF THE INVENTION

It is therefore an object of the present invention to provide an effective way to vaporize powders.

This object is achieved in a method for metering powdered or granular material onto or in close proximity to a heated surface to vaporize such material, comprising:

(a) providing a rotatable auger for receiving powdered or granular material and as the rotatable auger rotates, such rotating rotatable auger translates such powdered or granular material along a feed path to a feeding location;

(b) providing at least one opening at the feeding location such that the pressure produced by the rotating rotatable auger at the feeding location causes the powdered or granular material to be forced through the opening onto the heated surface in a controllable manner, and (c) agitating or fluidizing the powdered or granular material in proximity to the feeding location in cooperation with the rotatable auger so as to facilitate the flow of powdered or granular material through the opening(s) to the heated surface where the powdered or granular material is vaporized.

An advantage of this invention is that it provides controlled delivery of powdered or granular material with reduced expenditures of power. Feed uniformity is substantially improved.

DETAILED DESCRIPTION OF THE INVENTION

Figure 1:
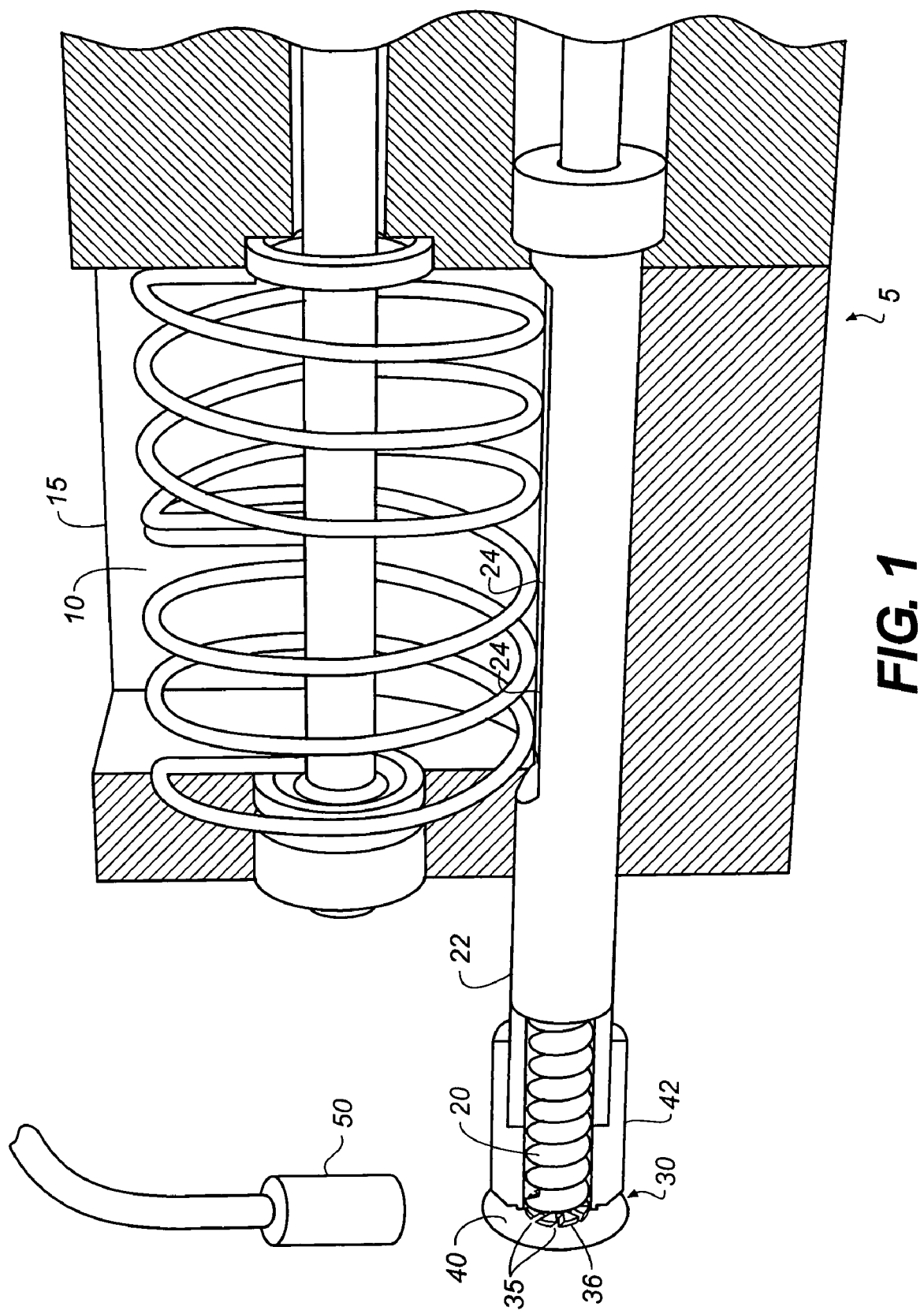
FIG. 1 is a sectional view of one embodiment of the invention.
Figure 2:
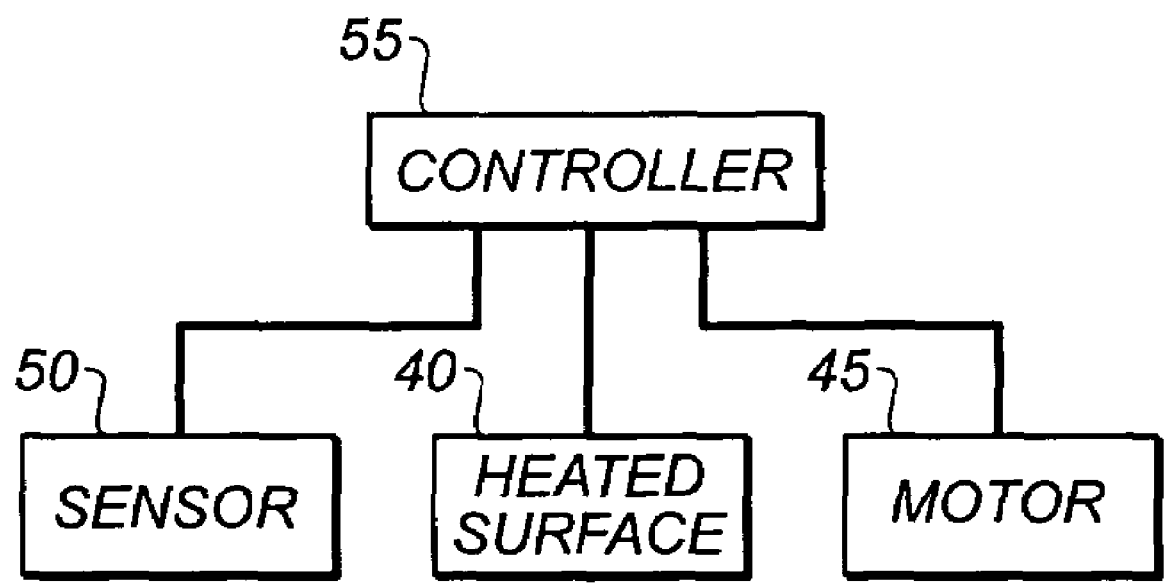
FIG. 2 is a block diagram of a closed-loop control for the invention.
Figure 3A:
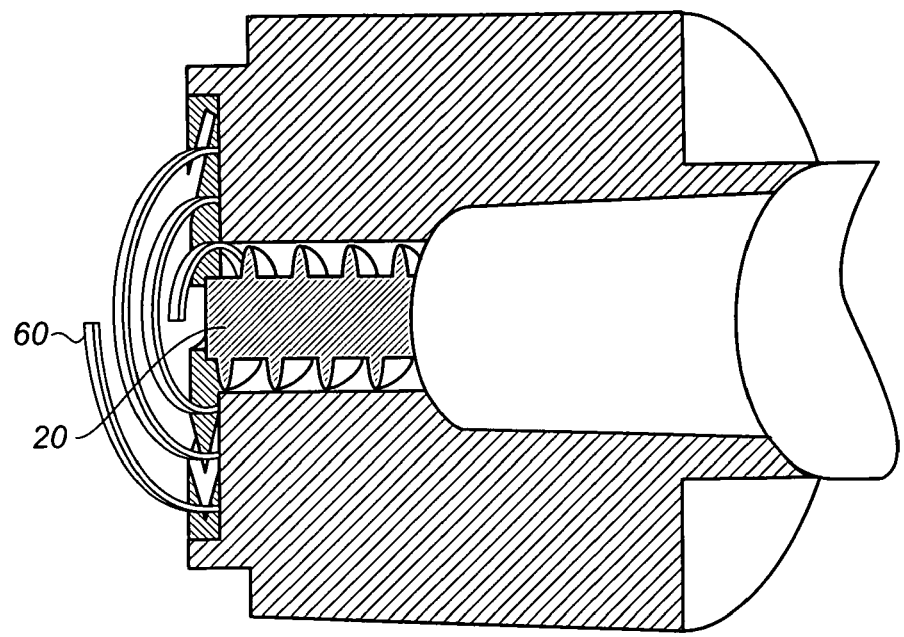
FIGS. 3A and 3B show detail cross-sectional perspectives of an alternative embodiment of the invention.
Figure 3B:
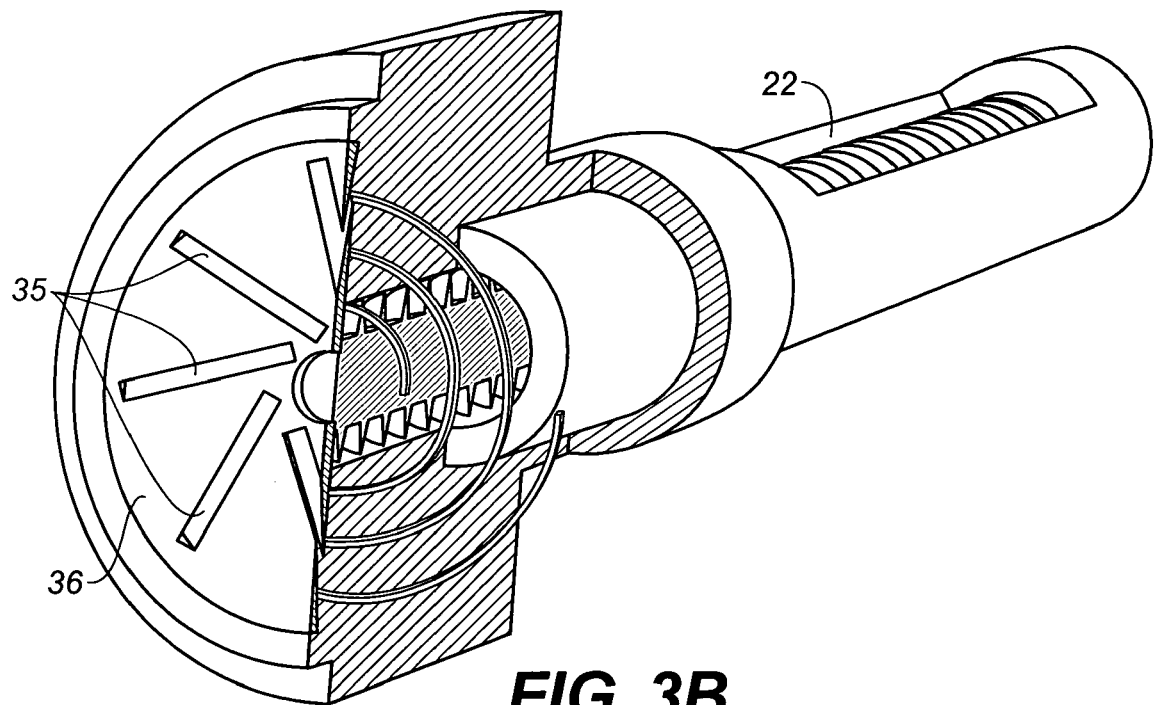
Figure 4:
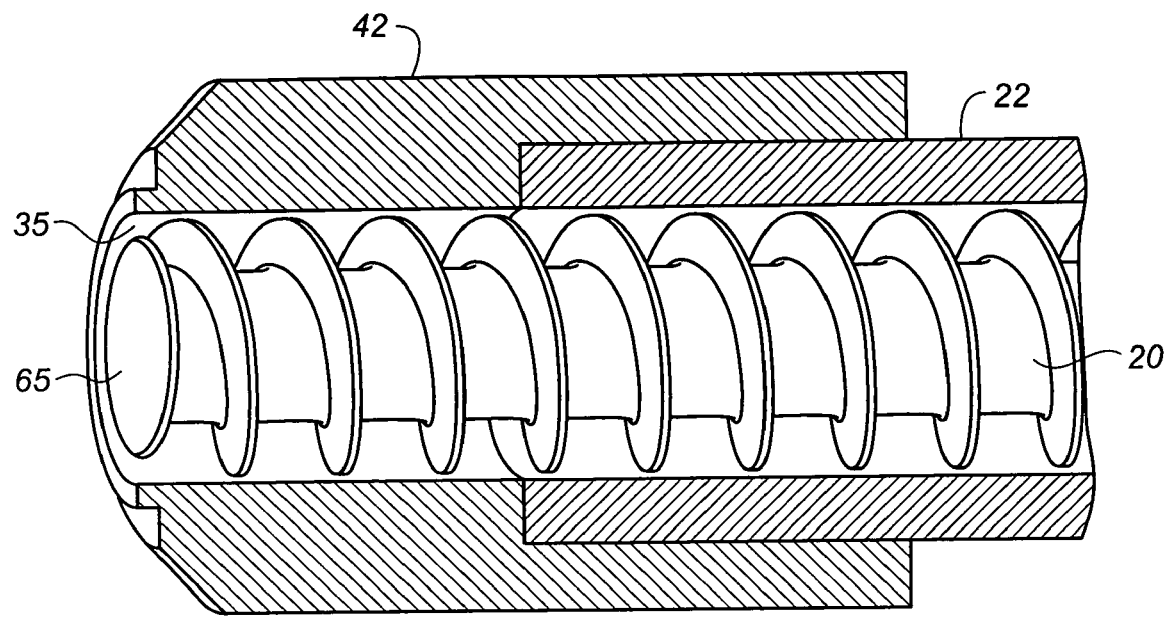
FIG. 4 is a detail cross-section perspective of another alternative embodiment of the invention.
Figure 5:
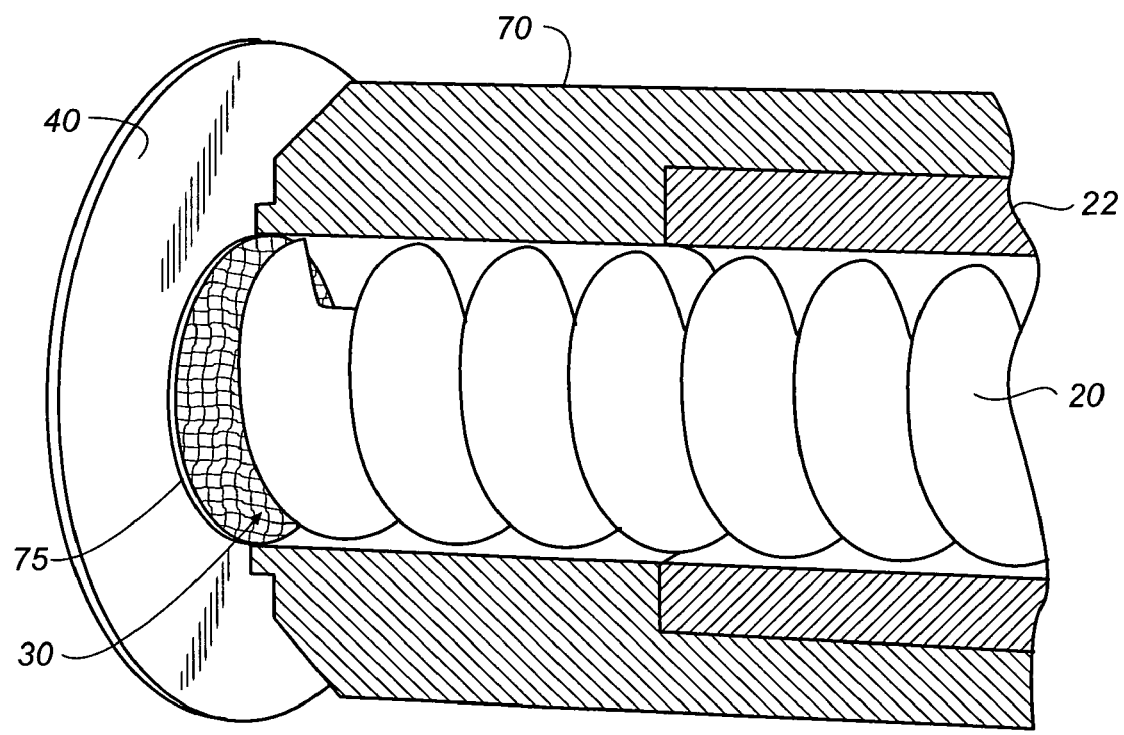
FIG. 5 is a detail cross-sectional perspective of still another alternative embodiment of the invention.

Turning now to FIG. 1, an apparatus 5 for metering powdered or granular material 10 such as organic material into a heated surface 40 is shown. The apparatus 5 is includes a container 15 which holds material 10. Material 10 can have one or more components and can be powdered or granular. A rotatable auger 20 is disposed in an auger enclosure 22 which in turn is disposed in a material receiving relationship with the container 15. The auger enclosure 22 has openings 24 for receiving material 10 from the container 5. The rotatable auger 20 moves material 10 along a feed path 25 to a feeding location 30. Rotation of the rotatable auger 20 causes the material 10 to be subject to pressure at the feeding location 30. This pressure forces the material 10 through one or more openings 35 formed in a member 36. Member, 36 can be attached to the rotatable auger 20 so that the member 36 rotates with the rotatable auger 20, and carries material 10 into contact with a heated surface 40 where the material 10 is flash evaporated. The rotation of member 36 provides agitation or fluidization of material 10 in the proximity to the openings 35, reducing the tendency of the material 10 to compact into an agglomerated solid inside the auger enclosure 22 or heat sink 42 that would restrict material flow. The proximity of the feeding location 30 to the heated surface 40 can cause the feeding location to be heated by radiation and the auger enclosure 22 by conduction from the feeding location 30. It can be desirable to coat the feeding location 30 and the openings 35 in member 36 with a thermally insulating layer such as anodization or a thin layer of glass or mica. Additionally, the feeding location 30 can be made of a material of high thermal conductivity and provided with a thermally conductive path to a heat sink 42. The heat sink 42 can be a passive device that depends on radiation or convection to a fluid, or it can be an active cooling device such as a Peltier effect chiller. Insulating the feeding location 30 can reduce condensation of vaporized material in the feeding location 30, especially around the openings 35. Providing a conductive path to heat sink 42, reduces thermal exposure of material 10, and thereby improves material lifetime within the auger enclosure 22.

The apparatus 5 can operate in a closed-loop control mode, in which case a sensor 50 is utilized to measure the vaporization rate of the material 10 as it is evaporated at the heated surface 40. The sensor 50 can also be used in measuring the material vaporization rate on a substrate either directly or indirectly. For example, a laser can be directed through the plume of evaporated material to directly measure the local concentration of vaporized material. Alternatively, crystal rate monitors indirectly measure the vaporization rate by measuring the rate of deposition of the vaporized material on the crystal surface. These two approaches represent only two of the many well-known methods for sensing the vaporization rate.

Turning now to FIG. 2, the apparatus 5 can be operated under closed-loop control which is represented by block diagram. In a close-loop control system, the sensor 50 provides data to a controller 55, which in turn determines the rate of revolution of a motor 45. The closed loop control can take many forms. In a particularly preferred embodiment, the controller 55 is a programmable digital logic device, such as a microcontroller, that reads the input of the sensor 50, which can be either analog input or direct digital input. The controller 55 is operated by an algorithm that utilizes the sensor input as well as internal or externally derived information about the motor 45 rotational speed and the temperature of the heated surface 40 to determine a new commanded speed for the rotatable auger 20 and a new commanded temperature for the heated surface 40. There are many known classes of algorithm, such as proportional integral differential control, proportional control, differential control, that can be adapted for use suited to control the apparatus 5. The control strategy can employ feedback as well as feedforward. Alternatively, the control circuit can be implemented as an analog control device, which can implement many of the same classes of algorithm as the digital device.

FIGS. 3A and 3B show different perspectives of the detail of an alternative embodiment. The portion of the embodiment not shown are essentially the same as those of FIG. 1. This embodiment differs in how the material 10 at the end of the rotatable auger 20 is fluidized or agitated. A clockwork spring 60 is attached to the rotatable auger 20 so that it rotates with the rotatable auger 20, agitating or fluidized material 10 in the vicinity of the member 36 containing the openings 35. The member 36 may be rigidly affixed to the auger enclosure 22 or may instead be constrained to rotate with the rotatable auger 20. By maintaining an agitated or fluidized region of material 10 in the immediate proximity of the member 36, the tendency of the material 10 to compact into an agglomerated solid inside the auger enclosure 22 is reduced.

FIG. 4 shows a detail view of yet another embodiment of the invention. In this embodiment, the rotatable auger 20 terminates in a spreader 65 which rotates with the rotatable auger 20. The spreader 65 is a cone-shaped member that spreads the material 10 away from the shaft of the rotatable auger 20 towards the opening 35. The single opening 35 is in the form of an annulus and is formed between the spreader 65 on the inside and heat sink 42. Heat sink 42, is rigidly attached to the auger enclosure 22. The rotation of the spreader 65 within the heat sink 42, sets up a shear in the material, causing agitation and reducing the tendency of the material 10 to compact into an agglomerated solid inside the auger enclosure 22 or the heat sink 42.

FIG. 5 shows a detail of another embodiment of the invention. In this embodiment, the openings are provided by a fine screen 75. A vibratory actuator 70 imparts vibrational energy to the screen 75 agitating or fluidizing the material 10 in the feeding location 30. The direction of the vibration may be co-axial to the rotatable auger 20, perpendicular to the axis of the rotatable auger 20, or both co-axial or perpendicular. Fluidized material 10 is forced through the screen 75 by the rotation of the rotatable auger 20. Material 10 passing through the screen 75 then encounters the heated surface 40 which is spaced a short distance from the screen 75. This distance is typically on the order of 50-100 microns, but could be larger or smaller depending on particle size of the material being fed, the size of the openings in the screen 75, and other factors.

It is understood by those of ordinary skill in the art that although the invention is motivated by the need to reduce the time organic materials spend at elevated temperature and is described in the context of vaporization of organic materials, the invention is suitable for vaporization of any powdered or granular material.

The invention has been described in detail with particular reference to certain preferred embodiments thereof, but it will be understood that variations and modifications can be effected within the spirit and scope of the invention.

PARTS LIST

5 Apparatus
10 Organic material
15 Container
20 Rotatable auger
22 Auger enclosure
24 Auger enclosure opening
30 Feeding location
35 Opening
36 Member
40 Heated surface
42 Heat sink
45 Motor
50 Sensor
55 Controller
60 Clockwork spring
65 Spreader
70 Vibratory actuator
75 Screen

The invention claimed is:

1. In a method for metering thermally sensitive powdered or granular material onto or in close proximity to a heated surface to vaporize such material, comprising:
   (a) providing a feeding location and a perforated member at the feeding location that is in proximity to but not touching the heated surface and that provides agitation or fluidization to the powdered or granular material;
   (b) providing a thermally conductive path from the perforated member at the feeding location to a heat sink;
   (c) providing an auger enclosure and a rotatable auger, whose terminus is at the feeding location, disposed in material receiving relationship for receiving powdered or granular material, and as the rotatable auger rotates such rotating rotatable auger translates such powdered or granular material to the feeding location such that the thermally conductive path reduces thermal exposure of the material and thereby improves the material lifetime within the auger enclosure;
   (d) providing openings in the perforated member such that the pressure produced by the rotating rotatable auger at the feeding location causes the powdered or granular material to be forced through the openings in the perforated member onto the heated surface in a controllable manner, and
   (e) agitating or fluidizing the powdered or granular material in proximity to the feeding location by the perforated member in cooperation with the rotatable auger so as to facilitate the flow of powdered or granular material through the openings in the perforated member to the heated surface where the powdered or granular material is flash evaporated.

2. The method of claim 1 wherein agitating or fluidizing powdered or granular material is achieved by providing the openings in the perforated member at the feeding location within one or more moving surfaces.

3. The method of claim 1 wherein the perforated member is a rotating agitator moving in cooperation with the rotatable auger.

4. The method of claim 1 wherein agitating or fluidizing the powdered or granular material is provided by introducing vibrational energy into the openings in the perforated member.

5. The method of claim 1 wherein the powdered or granular material is an organic material and is vaporized in order to deposit a thin film organic layer on an OLED surface.

6. The method of claim 1 further including controlling the speed of rotation of the rotatable auger and the temperature of the heated surface as a function of the vaporization rate.

7. The method of claim 1 further including controlling the rate of delivery of powdered or granular material through the openings in the perforated member.

* * * * *